United States Patent
Nakayama (10) Patent No.: US 11,121,689 B2
(45) Date of Patent: Sep. 14, 2021

(54) SENSOR FAILURE PREDICTION SYSTEM, SENSOR FAILURE PREDICTION METHOD, PHYSICAL QUANTITY SENSOR, ELECTRONIC APPARATUS, AND VEHICLE

(71) Applicant: SEIKO EPSON CORPORATION, Tokyo (JP)

(72) Inventor: Chikara Nakayama, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 27 days.

(21) Appl. No.: 16/824,133

(22) Filed: Mar. 19, 2020

(65) Prior Publication Data

US 2020/0304084 A1   Sep. 24, 2020

(30) Foreign Application Priority Data

Mar. 22, 2019 (JP) .............................. JP2019-054279

(51) Int. Cl.
*H03F 3/45* (2006.01)

(52) U.S. Cl.
CPC .................... *H03F 3/45475* (2013.01); *H03F 2203/45528* (2013.01)

(58) Field of Classification Search
CPC ........................................................ H03F 3/45

USPC .................................................. 330/252, 254
See application file for complete search history.

(56) References Cited

U.S. PATENT DOCUMENTS

| 6,049,741 A | 4/2000 | Kawamura |
| 10,318,370 B2 * | 6/2019 | Nakajima ................ H03K 5/19 |
| 2016/0276990 A1 | 9/2016 | Aoyama |
| 2017/0277585 A1 * | 9/2017 | Nakajima ............. H03K 19/21 |
| 2021/0105853 A1 * | 4/2021 | Kang .................... H04W 48/20 |

FOREIGN PATENT DOCUMENTS

| JP | H10-55497 A | 2/1998 |
| JP | 2000-171257 A | 6/2000 |
| JP | 2016-171542 A | 9/2016 |

* cited by examiner

*Primary Examiner* — Henry Choe
(74) *Attorney, Agent, or Firm* — Workman Nydegger (57) ABSTRACT

A sensor failure prediction system is a sensor failure prediction system that predicts a failure of a physical quantity sensor including a vibrator element which is driven and vibrates by a drive signal and outputs a detection signal based on a physical quantity, and includes a memory that stores reference information on a reference value of the drive signal or the detection signal, and a processor that outputs prediction information on a stepwise or continuous state until the physical quantity sensor fails, based on signal information on a measurement value of the drive signal or the detection signal and the reference information.

16 Claims, 7 Drawing Sheets

SENSOR FAILURE PREDICTION SYSTEM, SENSOR FAILURE PREDICTION METHOD, PHYSICAL QUANTITY SENSOR, ELECTRONIC APPARATUS, AND VEHICLE

The present application is based on, and claims priority from JP Application Serial Number 2019-054279, filed Mar. 22, 2019, the disclosure of which is hereby incorporated by reference herein in its entirety.

BACKGROUND

1. Technical Field

The present disclosure relates to a sensor failure prediction system, a sensor failure prediction method, a physical quantity sensor, an electronic apparatus, and a vehicle.

2. Related Art

A technology for determining failure of a physical quantity sensor such as a vibration type gyro sensor is known. For example, a technology described in JP-A-2000-171257 determines failure of an angular velocity detection device based on a leakage signal of a vibrator in an angular velocity detection device. More specifically, an output signal of an integration circuit that changes depending on an amplitude of the leakage signal is monitored, and when the output signal is within a predetermined range, a signal indicating that there is no abnormality is output, and while the output signal is outside the predetermined range, a signal indicating that there is an abnormality is output.

Since only two types of signals indicating that there is no abnormality and there is an abnormality are output in the technology described in JP-A-2000-171257, there is a problem that a state until the angular velocity detection device fails cannot be detected in advance.

SUMMARY

A sensor failure prediction system according to an aspect of the present disclosure is a sensor failure prediction system that predicts a failure of a physical quantity sensor including a vibrator element which is driven and vibrates by a drive signal and outputs a detection signal based on a physical quantity, and includes a memory that stores reference information on a reference value of the drive signal or the detection signal, and a processor that outputs prediction information on a stepwise or continuous state until the physical quantity sensor fails, based on signal information on a measurement value of the drive signal or the detection signal and the reference information.

A sensor failure prediction method according to an aspect of the present disclosure includes acquiring signal information on a measurement value of the drive signal or the detection signal from a physical quantity sensor including a vibrator element which is driven and vibrates by a drive signal and outputs a detection signal based on a physical quantity, and outputting prediction information on a stepwise or continuous state until the physical quantity sensor fails, based on the signal information and reference information on a reference value of the drive signal or the detection signal.

A physical quantity sensor according to an aspect of the present disclosure includes a vibrator element that is driven and vibrates by a drive signal and outputs a detection signal based on a physical quantity, a memory that stores reference information on a reference value of the drive signal or the detection signal, and a processor that outputs prediction information on a stepwise or continuous state until the physical quantity sensor fails, based on signal information on a measurement value of the drive signal or the detection signal and the reference information.

DESCRIPTION OF EXEMPLARY EMBODIMENTS

Hereinafter, preferred embodiments of the present disclosure will be described with reference to the accompanying drawings. In the drawings, dimensions or scales of the respective portions are different from actual dimensions or scales as appropriate, and some portions are schematically illustrated for easy understanding. Further, the scope of the present disclosure is not limited to the embodiments unless stated otherwise to limit the present disclosure in particular.

A-1. Outline of Sensor Failure Prediction System

Figure 1:
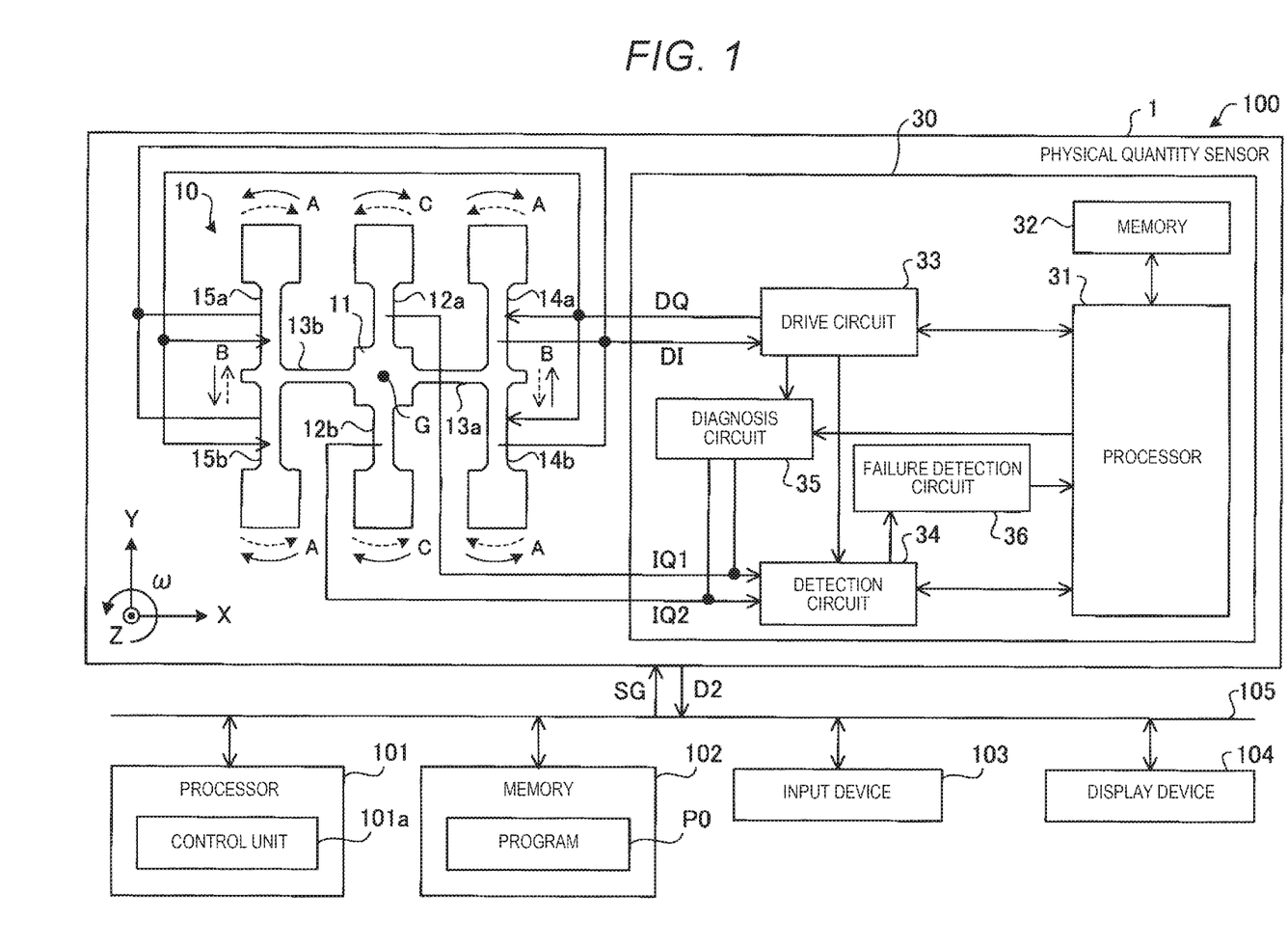
FIG. 1 is a diagram illustrating a schematic configuration of a sensor failure prediction system according to an embodiment.
Figure 2:
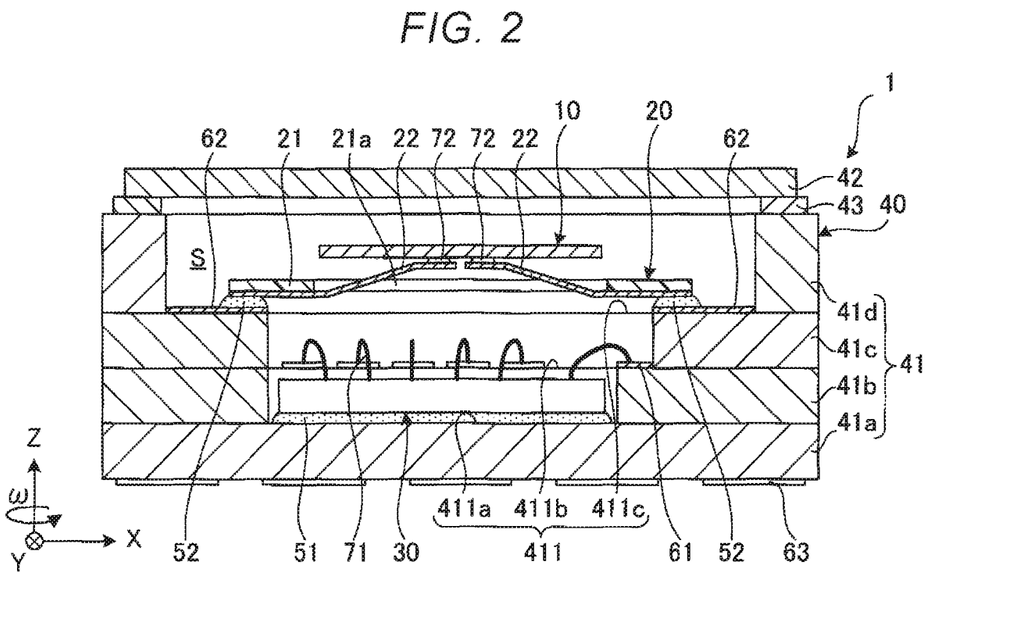
FIG. 2 is a sectional view illustrating a configuration example of a physical quantity sensor according to the embodiment.

FIG. 1 is a diagram illustrating a schematic configuration of a sensor failure prediction system 100 according to an embodiment. FIG. 2 is a sectional view illustrating a configuration example of a physical quantity sensor according to the embodiment. The sensor failure prediction system 100 is a system that predicts failure of a physical quantity sensor 1. The sensor failure prediction system 100 includes the physical quantity sensor 1, a processor 101, a memory 102, an input device 103, and a display device 104. These are connected via a bus 105 so as to be communicable to each other.

The physical quantity sensor 1 is a gyro sensor that detects an angular velocity that is an example of a physical quantity.

In the example illustrated in FIG. 1, the physical quantity sensor 1 is a vibration type gyro sensor having a vibrator element 10. The vibrator element 10 is driven and vibrated by a drive signal DQ, and outputs detection signals IQ1 and IQ2 based on an angular velocity W which is an example of a physical quantity. The circuit element 30 is electrically connected to the vibrator element 10. The circuit element 30 has a function of outputting the drive signal DQ for driving the vibrator element 10 while receiving a feedback signal DI from the vibrator element 10, a function of detecting the detection signals IQ1 and IQ2 from the vibrator element 10, and a function of outputting prediction information D2 until the physical quantity sensor 1 fails. The physical quantity sensor 1 outputs a signal including the prediction information D2 to the outside. The signal may include other information such as detection information relating to a physical quantity detected by the physical quantity sensor 1. An output of the signal is performed, for example, in response to an external signal SG. The physical quantity sensor 1 will be described in detail below.

The processor 101 is a device having a function of controlling each unit of the sensor failure prediction system 100 and a function of processing various data. The processor 101 is configured to include, for example, a processor such as a central processing unit (CPU). The processor 101 may be configured by a single processor or a plurality of processors. Further, some or all of the functions of the processor 101 may be implemented by hardware such as a digital signal processor (DSP), an application specific integrated circuit (ASIC), a programmable logic device (PLD), and a field programmable gate array (FPGA).

The memory 102 is a device that stores various programs including a program P0 executed by the processor 101 and various data processed by the processor 101. The memory 102 is configured to include, for example, a hard disk drive or a semiconductor memory. A part or the whole of the memory 102 may be provided in a memory or a server outside the sensor failure prediction system 100.

The input device 103 is an apparatus that receives an operation from a user. For example, the input device 103 is configured to include a pointing device such as a touch pad, a touch panel, or a mouse. Here, when the input device 103 is configured to include the touch panel, the input device 103 may also serve as a display device 104. The input device 103 may be provided as necessary and may be omitted.

The display device 104 displays various images under a control of the processor 101. The display device 104 includes various display panels such as a liquid crystal display panel or an organic electro-luminescence (EL) display panel. The display device 104 may be provided as necessary and may be omitted.

In the sensor failure prediction system 100 having the above-described schematic configuration, the processor 101 functions as a control unit 101a by reading and executing the program P0. The control unit 101a performs predetermined processing based on the prediction information D2 from the physical quantity sensor 1. The predetermined processing is appropriately determined according to a type of an electronic apparatus or a vehicle in which the sensor failure prediction system 100 is incorporated. For example, the control unit 101a displays an image based on the prediction information D2 on the display device 104, or stops an operation according to the detection result of the physical quantity sensor 1 in the electronic apparatus or the vehicle based on the prediction information D2. A specific example of the predetermined processing will be given in the description on the electronic apparatus and the vehicle which will be described below.

A-2. Configuration of Physical Quantity Sensor

FIG. 2 is a sectional view illustrating a configuration example of the physical quantity sensor 1 according to the embodiment. Hereinafter, the configuration example of the physical quantity sensor 1 will be described with reference to FIGS. 1 and 2. Hereinafter, for the sake of convenient description, an X axis, a Y axis, and a Z axis that are orthogonal to each other will be used as appropriate. In FIGS. 1 and 2, arrows representing the axes are appropriately illustrated. A side indicated by the arrow is a +side, and an opposite side thereof is a-side. Further, one or both of a +X direction and a −X direction are simply referred to as an "X direction", and one or both of a +Y direction and a −Y direction are simply referred to as a "Y direction", and one or both of a +Z direction and a −Z direction are simply referred to as a "Z direction". Here, the Z direction is a thickness direction of the vibrator element 10. Viewing from the −Z direction or the +Z direction is called a "plan view".

The physical quantity sensor 1 illustrated in FIGS. 1 and 2 is a vibration type gyro sensor that detects the angular velocity ω around the Z axis. As illustrated in FIG. 2, the physical quantity sensor 1 includes the vibrator elements 10, a support member 20, a circuit element 30, and a package 40. Each of the vibrator elements 10, the support member 20, and the circuit element 30 is contained in the package 40. Here, the vibrator element 10 is supported by the package 40 via the support member 20. Hereinafter, each unit of the physical quantity sensor 1 will be briefly described in sequence.

The vibrator element 10 illustrated in FIGS. 1 and 2 is a sensor element made of a piezoelectric material. An example of the piezoelectric material includes a piezoelectric material such as quartz crystal, lithium tantalate, or lithium niobate. Among these, it is preferable to use the quartz crystal as a configuration material of the vibrator element 10. In this case, frequency-temperature characteristics of the vibrator element 10 can be improved as compared with a case where other piezoelectric materials are used. Hereinafter, a case where the vibrator element 10 is made of the quartz crystal will be described. The X-axis, the Y-axis, and the Z-axis illustrated in the respective figures correspond to an electric axis, a mechanical axis, and an optical axis, respectively, which are crystal axes of quartz crystal configuring the vibrator element 10. In FIGS. 1 and 2, illustration of an electrode provided on a surface of the vibrator element 10 is omitted.

The vibrator element 10 has a so-called double T-type structure. Specifically, the vibrator element 10 includes a base portion 11, a first detection arm 12a and a second detection arm 12b extending from the base portion 11 in the +Y direction and the −Y direction, a first connection arm 13a and a second connection arm 13b extending from the base portion 11 in the +X direction and the −X direction, a first drive arm 14a and a first drive arm 14b extending from the first connection arm 13a in the +Y direction and the −Y direction, and a second drive arm 15a and a second drive arm 15b extending from the second connection arm 13b in the +Y direction and the −Y direction. A shape of each unit of the vibrator element 10 is not limited to the shape illustrated in FIG. 1. For example, each arm of the vibrator element 10 may be appropriately provided with a groove or a hole that opens in the Z direction along a direction in which the arm extends. Further, a width of each arm may be constant.

Although not illustrated, the first drive arm 14a, the first drive arm 14b, the second drive arm 15a, and the second drive arm 15b are provided with a pair of drive electrodes that make the respective drive arms perform flexural vibration in the X direction. The drive signal DQ is input to one of the pair of drive electrodes, and the feedback signal DI is output from the other. Further, although not illustrated, the first detection arm 12a and the second detection arm 12b are provided with a pair of detection electrodes for detecting charges generated by the flexural vibration in the X direction of each of the detection arms. The detection signal IQ1 is output from one of the pair of detection electrodes, and the detection signal IQ2 is output from the other. Further, the base portion is provided with a plurality of terminals that are electrically connected to the pair of drive electrodes and the pair of detection electrodes. Configuration materials of the above-described drive electrode, detection electrode, and terminal are not limited in particular, and an example thereof includes a metal material such as gold (Au), chromium (Cr), or titanium (Ti).

Hereinafter, detection of the angular velocity ωwill be briefly described by using the vibrator element 10, and first, an alternating voltage is applied between a pair of drive electrodes (not illustrated) by the drive signal DQ. Then, as indicated by an arrow A in FIG. 1, the first drive arm 14a and the second drive arm 15a perform flexural vibration in opposite side in the X direction and are in the same phase with the first drive arm 14a and the second drive arm 15a, and the first drive arm 14b and the second drive arm 15b perform the flexural vibration in opposite sides in the X direction. At this time, when no angular velocity is applied to the vibrator element 10, the first drive arms 14a and 14b and the second drive arms 15a and 15b vibrate symmetrically with respect to a YZ plane passing through the center of gravity G of the vibrator element 10, and thereby, the base portion 11, the first connection arm 13a, the second connection arm 13b, the first detection arm 12a, and the second detection arm 12b hardly vibrate.

When the angular velocity ω around the Z axis is applied to the vibrator element 10 in a state where the first drive arms 14a and 14b and the second drive arms 15a and 15b perform the flexural vibration as described above, a Coriolis force in the Y direction is applied to each of the drive arms. As illustrated by an arrow B in FIG. 1, due to the Coriolis force, the first connection arm 13a and the second connection arm 13b perform the flexural vibration in opposite side in the Y direction. According to this, as illustrated by an arrow C in FIG. 1, the flexural vibrations of the first detection arm 12a and the second detection arm 12b in the X direction are excited as detection vibrations so as to cancel the flexural vibration. Electric charges generated between the pair of detection electrodes by the detection vibration are output as a detection signal. The angular velocity ω is obtained based on the detection signal. As described above, the angular velocity ω can be detected.

As illustrated in FIG. 2, the support member 20 is a substrate for mounting tape automated bonding (TAB). The support member 20 includes a film 21 and a plurality of wires 22. The film 21 is an insulating material made of a resin material such as polyimide. A device hole 21a is formed at a central portion of the film 21. The plurality of wires 22 are provided corresponding to a pair of drive electrodes and a pair of detection electrodes (not illustrated) in the vibrator element 10 described above. The plurality of wires 22 are bent and extended from one surface of the film 21 to the other surface side of the film 21 through the device hole 21a. Each of the plurality of wires 22 is connected to the base portion 11 of the above-described vibrator element 10 through a metal bump 72. With this connection, the plurality of wires 22 support the vibrator element 10 in a state of being electrically connected to the pair of drive electrodes and the pair of detection electrodes (not illustrated) in the vibrator element 10.

As illustrated in FIG. 1, the circuit element 30 is an integrated circuit including a processor 31, a memory 32, a drive circuit 33, a detection circuit 34, a diagnosis circuit 35, and a failure detection circuit 36. Each circuit of the circuit element 30 will be described in detail below. Further, although not illustrated, the circuit element 30 is provided with a plurality of terminals for the feedback signal DI, the drive signal DQ, the detection signals IQ1 and IQ2, and the like described above.

As illustrated in FIG. 2, the package 40 is a container that contains the vibrator element 10, the support member 20, and the circuit element 30. The package 40 includes a base 41, a lid 42, and a bonding member 43. The base 41 and the lid 42 are bonded to each other via the bonding member 43. As illustrated in FIG. 2, a space S that contains the vibrator element 10, the support member 20, and the circuit element 30 is formed between the base 41 and the lid 42. The space S is, for example, in a reduced pressure state of 10 Pa or less. The space S may be filled with an inert gas such as argon or nitrogen.

The base 41 is a box-shaped member having a concave portion 411. An outer shape of the base 41 in a plan view is substantially rectangular. Although not limited in particular, various ceramics such as aluminum oxide are used as a configuration material of the base 41. In the example illustrated in FIG. 2, the base 41 has a flat substrate 41a, three frame-shaped substrates 41b, 41c, and 41d, which are sequentially stacked in the +Z direction. Although not illustrated, wires made of metal or the like are appropriately provided between the plurality of substrates configuring the base 41. A shape of the base 41 or the number of substrates configuring the base 41 is not limited to the example illustrated in FIG. 2 and is random.

A concave portion 411 includes a bottom surface 411a configured by a surface on the +Z direction side of the substrate 41a, a stepped surface 411b configured by a surface on the +Z direction side of the substrate 41b, and a stepped surface 411c configured by a surface on the +Z direction side of the substrate 41c.

The circuit element 30 is fixed to the bottom surface 411a via a fixing member 51 in a state of being fitted inside the substrate 41b. The fixing member 51 is an adhesive formed to include, for example, an epoxy resin or an acrylic resin. A plurality of internal terminals 61 are provided on the stepped surface 411b. The plurality of internal terminals 61 are electrically connected to a plurality of terminals (not illustrated) of the circuit element 30 via a plurality of wires 71. Each of the plurality of wires 71 is configured by, for example, a bonding wire. A plurality of internal terminals 62 are provided on the stepped surface 411c. The plurality of internal terminals 62 are provided corresponding to the plurality of wires 22 of the support member 20 described above. The plurality of wires 22 of the support member 20 are fixed to the plurality of internal terminals 62 via a plurality of conductive fixing members 52. By the fixing, the plurality of internal terminals 62 are electrically connected to a pair of drive electrodes and a pair of detection electrodes (not illustrated) in the vibrator element 10 described above. Each of the plurality of fixing members 52 is made of, for example, solder, silver paste, a conductive adhesive, or the like.

Although not illustrated, the plurality of internal terminals 61 and the plurality of internal terminals 62 are appropriately connected to a plurality of wires provided inside the base 41. Specifically, the plurality of wires include a plurality of wires that connect some of the plurality of internal terminals 61 to the plurality of internal terminals 62, and a plurality of wires that connect the remaining terminals of the plurality of internal terminals 61 to a plurality of external terminals 63 on an outer surface of the base 41. The plurality of external terminals 63 are used when the physical quantity sensor 1 is mounted on an external apparatus (not illustrated). The internal terminals 61 and 62 and the external terminals 63 are respectively formed by metal films obtained by plating a metallized layer of, for example, tungsten (W) or the like with a film of nickel (Ni), gold (Au), or the like on.

The lid 42 is a plate-shaped member that has a substantially rectangular outer shape in a plan view and closes an opening of the concave portion 411 of the base 41 described above. A material of the lid 42 may be a material that can be seam-welded to the base 41 or the bonding member 43, and includes metals such as Kovar, 42 alloy, and stainless steel. Further, a surface on the base 41 side in the lid 42 is appropriately plated with a film of, for example, nickel (Ni) or the like.

The bonding member 43 is a frame-shaped member that is interposed between the base 41 and the lid 42 and bonds the base 41 to the lid 42. The bonding member 43 is also referred to as a seal ring in general. The bonding member 43 is made of, for example, a metal such as Kovar, 42 alloy, or stainless steel. Further, a surface of the bonding member 43 is appropriately plated with, for example, a film of nickel (Ni), gold (Au) or the like. The above-described bonding member 43 is airtightly bonded to the base 41 by soldering using a silver solder or the like. Further, the bonding member 43 is airtightly joined to the lid 42 by seam welding. By the bonding, the base 41 and the lid 42 are bonded together via the bonding member 43. Instead of the bonding member 43, a metal film formed by plating a metallized layer of tungsten (W) or the like with a film of nickel (Ni), gold (Au), or the like may be provided on the base 41.

A-3. Details of Circuit Elements

Figure 3:
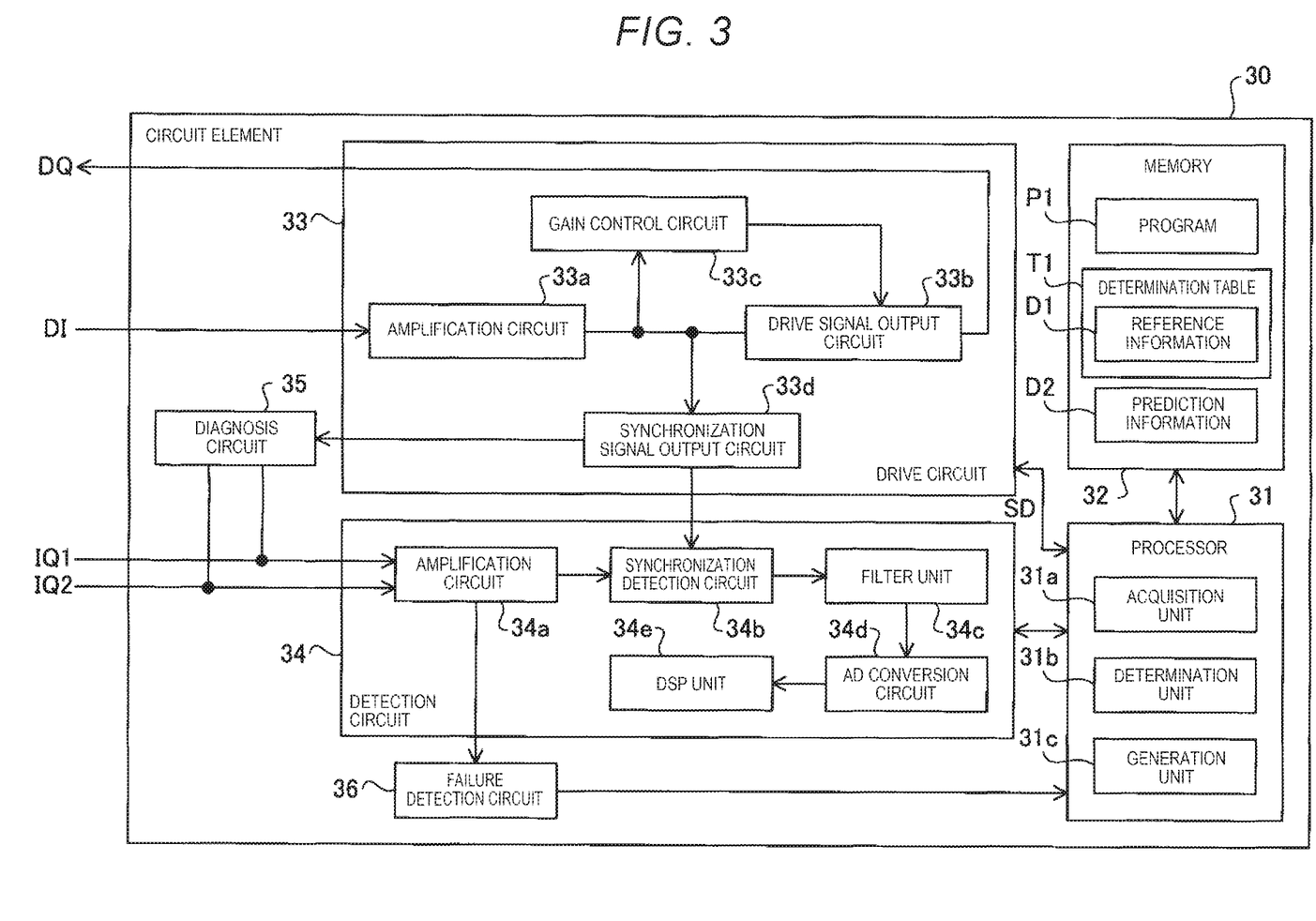
FIG. 3 is a block diagram illustrating a configuration of a circuit element included in the physical quantity sensor according to the embodiment.

FIG. 3 is a block diagram illustrating a configuration of the circuit element 30 included in the physical quantity sensor 1 according to the embodiment. As illustrated in FIG. 3, the circuit element 30 includes the processor 31, the memory 32, the drive circuit 33, the detection circuit 34, the diagnosis circuit 35, and the failure detection circuit 36.

The processor 31 is a device having a function of controlling each unit of the physical quantity sensor 1 and a function of processing various data. The processor 31 includes, for example, a processor such as a CPU. The processor 31 may be configured by a single processor or a plurality of processors. Further, some or all of the functions of the processor 31 may be implemented by hardware such as a DSP, an ASIC, a PLD, or a FPGA.

The memory 32 is a device that stores various programs including a program P1 executed by the processor 31, and various data including a determination table T1 and prediction information D2 processed by the processor 31. The memory 32 includes, for example, a semiconductor memory. The determination table T1 includes reference information D1. The determination table T1 and the prediction information D2 will be described in detail below.

The drive circuit 33 outputs the drive signal DQ for driving the vibrator element 10 while receiving the feedback signal DI from the vibrator element 10. The drive circuit 33 includes an amplification circuit 33a, a drive signal output circuit 33b, a gain control circuit 33c, and a synchronization signal output circuit 33d. The amplification circuit 33a amplifies the feedback signal DI from the vibrator element 10, converts a current signal into a voltage signal, and outputs the voltage signal. The amplification circuit 33a is configured to include, for example, an operational amplifier, a feedback resistance element, a feedback capacitor, and the like. The drive signal output circuit 33b outputs the drive signal DQ based on a signal output from the amplification circuit 33a. For example, when a waveform of the drive signal DQ is a rectangular wave or a sine wave, the drive signal output circuit 33b is configured to include a comparator and the like. The gain control circuit (AGC) 33c controls the drive signal output circuit 33b based on the signal output from the amplification circuit 33a, thereby controlling an amplitude of the drive signal DQ. The gain control circuit 33c is configured to include, for example, a full-wave rectifier that performs a full-wave rectification on the signal from the amplification circuit 33a, and an integrator that performs integration processing on an output signal of the full-wave rectifier. The synchronization signal output circuit 33d outputs a synchronization signal based on the signal output from the amplification circuit 33a to each of the detection circuit 34 and the diagnosis circuit 35. The synchronization signal output circuit 33d is configured to include, for example, a comparator that generates a synchronization signal of a rectangular wave by binarizing a sine wave signal output from the amplification circuit 33a, and a phase adjustment circuit that adjusts a phase of the synchronization signal.

The detection circuit 34 detects the detection signals IQ1 and IQ2 from the vibrator element 10. The detection circuit 34 includes an amplification circuit 34a, a synchronization detection circuit 34b, a filter unit 34c, an AD conversion circuit 34d, and a DSP unit 34e. The amplification circuit 34a differentially amplifies the detection signals IQ1 and IQ2 from the vibrator element 10, converts a charge signal into a voltage signal, and outputs the voltage signal. The synchronization detection circuit 34b performs a synchronization detection of a signal from the amplification circuit 34a based on the synchronization signal from the drive circuit 33. The filter unit 34c is a low-pass filter that removes unnecessary signal components from the signal output from the synchronization detection circuit 34b. The AD conversion circuit 34d receives a signal from the synchronization detection circuit 34b via the filter unit 34c, and converts the input signal from an analog signal to a digital signal. The DSP unit 34e performs digital signal processing such as digital filter processing and digital correction processing for the digital signal from the AD conversion circuit 34d.

The diagnosis circuit 35 diagnoses the detection circuit 34. For example, the diagnosis circuit 35 performs an operation for generating a pseudo angular velocity signal or the like for diagnosing the detection circuit 34 and supplying the pseudo angular velocity signal to the detection circuit 34. Then, a diagnosis is performed to determine whether or not the detection circuit 34 or the like is operating normally, based on the detection result of the pseudo angular velocity signal or the like. The diagnosis circuit 35 may be provided as necessary and may be omitted.

The failure detection circuit 36 detects failure of the amplification circuit 34a included in the detection circuit 34. For example, the failure detection circuit 36 detects the failure of the amplification circuit 34a based on whether or not an output voltage is within a determination voltage range, based on the output voltages of two amplifiers configuring a differential amplification circuit in the amplification circuit 34a. The failure detection circuit 36 may be provided as necessary and may be omitted.

In the circuit element 30 having the above-described configuration, the processor 31 reads the program P1 from the memory 32 and executes the program. By the execution, the processor 31 functions as an acquisition unit 31a, a determination unit 31b, and a generation unit 31c.

The acquisition unit 31a acquires signal information SD relating to a measurement value of the drive signal DQ from the drive circuit 33. The measurement value in the present embodiment is a voltage value of the drive signal DQ. The determination unit 31b reads reference information D1 from the memory 32, and determines a state until the physical quantity sensor 1 fails based on the signal information SD and the reference information D1. More specifically, the determination unit 31b reads the determination table T1 from the memory 32, compares the signal information SD with the reference information D1, and determines a stepwise state until the physical quantity sensor 1 fails based on the comparison result. The generation unit 31c generates the prediction information D2, based on the determination result of the determination unit 31b. More specifically, the generation unit 31c reads the determination table T1 from the memory 32 and generates the prediction Information D2 relating to the stepwise state until the physical quantity sensor 1 fails based on the determination table T1 and the determination result of the determination unit 31b.

As described above, the physical quantity sensor 1 includes the package 40 that contains the vibrator element 10. The prediction information D2 includes information on prediction of failure due to a degree of vacuum in the package 40. If the degree of vacuum in the package 40 is reduced for some reason, characteristics of the physical quantity sensor 1 also are reduced, and eventually, the physical quantity sensor 1 fails. Here, a reduction in the degree of vacuum in the package 40 is usually slow. Accordingly, information on the prediction of the failure due to the degree of vacuum in the package 40 is suitable for the prediction information D2 on the stepwise or continuous state until the physical quantity sensor 1 fails.

Figure 4:
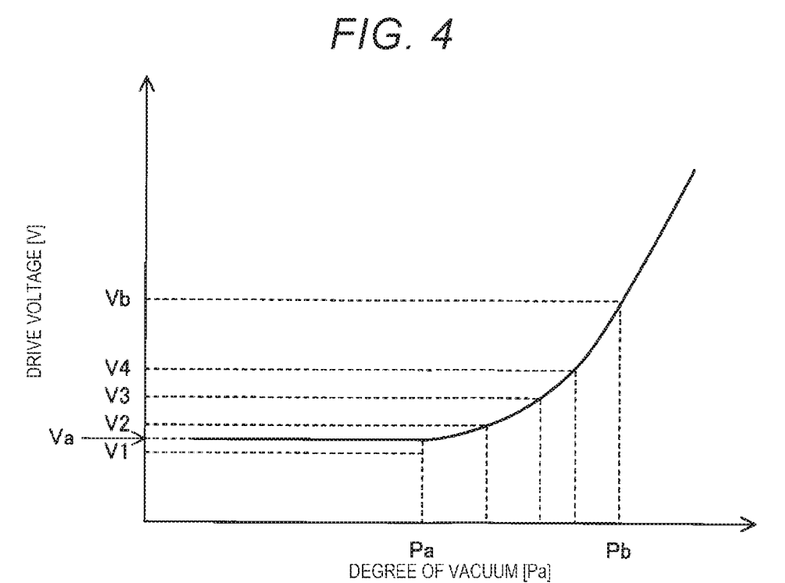
FIG. 4 is a graph illustrating a relationship between a degree of vacuum in a package and a drive voltage of the physical quantity sensor.

FIG. 4 is a graph illustrating a relationship between the degree of vacuum in the package 40 of the physical quantity sensor 1 and a drive voltage that is a voltage value of the drive signal DQ. As illustrated in FIG. 4, the drive voltage increases as the degree of vacuum in the package 40 decreases, that is, as a pressure in the space S of the package 40 increases. Here, when a voltage signal from the amplification circuit 33a is within an adjustable range of the gain control circuit 33c, the drive voltage is maintained constant at or near a specified value. Accordingly, in this case, a detection sensitivity of the physical quantity sensor 1 is maintained within a desirable range. On the other hand, when the voltage signal from the amplification circuit 33a is not within the adjustable range of the gain control circuit 33c, the driving voltage deviates from the specified value. Accordingly, in this case, the detection sensitivity of the physical quantity sensor 1 is reduced. From the above description, in this embodiment, the drive voltage, that is, a voltage value of the drive signal DQ is used as the measurement value of the drive signal DQ. Then, the determination unit 31b determines a state until the physical quantity sensor 1 fails based on the signal information SD on the voltage value of the drive signal DQ and the reference information D1. More specifically, the determination unit 31b determines a state until the physical quantity sensor 1 fails by using the determination table T1 as described below.

Figure 5:
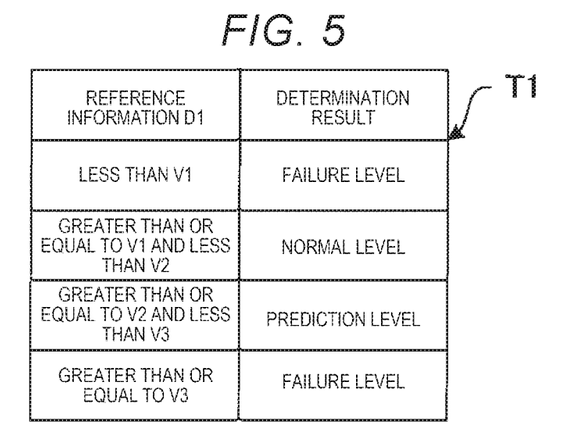
FIG. 5 is a diagram illustrating an example of a determination table indicating a relationship between reference information and a determination result.
Figure 6:
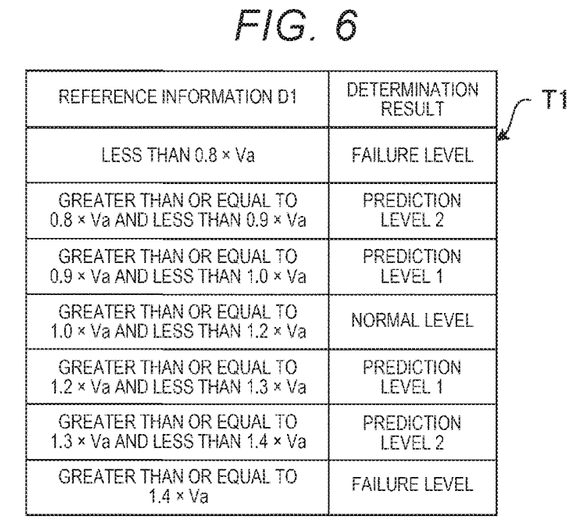
FIG. 6 is a diagram illustrating another example of the determination table indicating the relationship between the reference information and the determination result.

FIG. 5 is a diagram illustrating an example of the determination table T1 indicating a relationship between the reference information D1 and the determination result. FIG. is a diagram illustrating another example of the determination table T1 indicating the relationship between the reference information D1 and the determination result. The determination unit 31b determines the state until the physical quantity sensor 1 fails by using, for example, the determination table T1 illustrated in FIG. 5 or 6. The determination table T1 illustrated in FIG. 5 or 6 is information indicating an association between each reference value of the reference information D1 and the determination result. Each numerical value range in the determination table T1 is not limited to the examples illustrated in FIGS. 5 and 6 and is random.

When the determination table T1 illustrated in FIG. 5 is used, when the drive voltage is greater than or equal to V1 and less than V2, the determination unit 31b determines to be at a normal level. Further, when the drive voltage is less than V1 or greater than or equal to V3, the determination unit 31b determines to be at a failure level. Further, when the drive voltage is greater than or equal to V2 and less than V3, the determination unit 31b determines to be at a prediction level of failure. Here, V1 is a value slightly lower than a reference value Va which is a specified value and is, for example, approximately 0.9 times the value Va. V2 is a value slightly higher than the reference value Va and is, for example, approximately 1.2 times the value Va. V3 is higher than V2 and is approximately 1.3 times the voltage Va.

When the determination table T1 illustrated in FIG. 6 is used, when the drive voltage is 1.0 to 1.2 times the reference value Va, the determination unit 31b determines to be at a normal level. Further, when the drive voltage is less than 0.8 times the reference voltage Va or is greater than or equal to 1.4 times the reference voltage Va, the determination unit 31b determines to be failure. Further, when the drive voltage is 0.9 to 1.0 times the reference voltage Va or 1.2 to 1.3 times the reference value Va, the determination unit 31b determines to be at a prediction level 1 of failure. Further, when the drive voltage is 0.8 times or more and less than 0.9 times or 1.3 times or more and less than 1.4 times the reference value Va, the determination unit 31b determines to be at a prediction level 2 of failure closer to a failure state than the prediction level 1 of failure. Here, a range of 0.9 times or more and 1.0 times or less, or 1.2 times or more and 1.3 times or less is a first range indicating a range for the reference value Va, and a range of 0.8 times or more and 0.9 times or less or 1.3 times or more and 1.4 times or less is a second range indicating a range for the reference value Va in a range different from the first range. As described above, when the determination table T1 illustrated in FIG. 6 is used, the reference information D1 includes the first range and the second range, and the processor 31 outputs a prediction level 1 that is first prediction information when a measurement value of the drive signal DQ is within the first range, and outputs a prediction level 2 that is second prediction information different from the first prediction information when the measurement value of the drive signal DQ is within the second range. Accordingly, it is possible to output the prediction information D2 on the stepwise state before the physical quantity sensor 1 fails.

Further, the reference information D1 or the determination table T1 may be stored in the memory 32 in advance before the physical quantity sensor 1 is shipped from a factory or may be stored in the memory 32 by a user when the physical quantity sensor 1 is used. However, the reference information D1 or the determination table T1 is preferably stored in the memory 32 in advance. In this case, it is not necessary to generate the reference information D1 after the physical quantity sensor 1 starts up. As a result, the prediction information D2 can be quickly output immediately after the physical quantity sensor 1 starts up.

The generation unit 31c generates the prediction information D2, based on the determination result described above. That is, the generation unit 31c generates the prediction information D2 when the determination result of the determination unit 31b is the prediction level, the prediction level 1, or the prediction level 2. Further, when the determination result of the determination unit 31b is the failure level, the generation unit 31c generates failure information indicating that the physical quantity sensor 1 is in a failure state. Depending on a degree of the failure level of the determination result, the failure information can be said to be "prediction information".

Timing when the prediction information D2 is generated and output is not limited in particular and preferably includes at least time when the physical quantity sensor 1 starts up. That is, it is preferable that the processor 31 acquires signal information of the drive signal DQ and outputs the prediction information D2 when the physical quantity sensor 1 starts up. In this case, it is possible to reduce use of the physical quantity sensor 1 in a failed state. Generation and output of the prediction information D2 may be performed continuously all the time during an operation of the physical quantity sensor 1.

Figure 7:
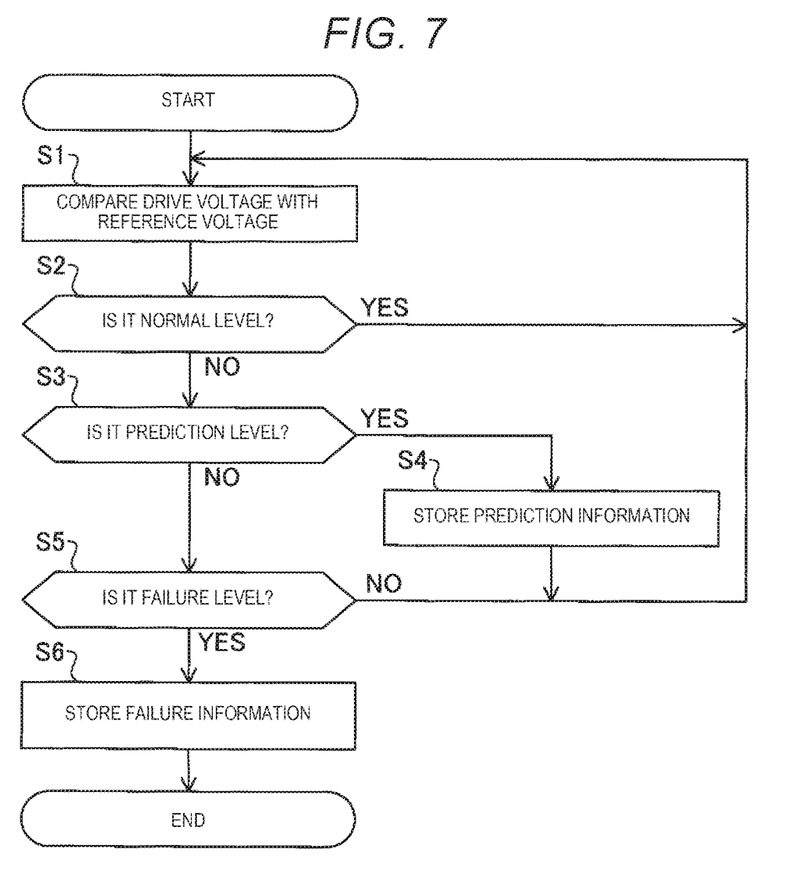
FIG. 7 is a diagram illustrating an operation flow of the sensor failure prediction system according to the embodiment.

FIG. 7 is a diagram illustrating a flow of an operation of the sensor failure prediction system 100 according to the embodiment. As illustrated in FIG. 7, first, the acquisition unit 31a acquires information on a drive voltage, the determination unit 31b compares the drive voltage with a reference value of the reference information D1 to determine a state of the physical quantity sensor 1 (step S1). Thereafter, the generation unit 31c determines whether or not the determination result is a normal level (step S2). If the determination result is a normal level, the processing returns to step S1.

When the determination result is not the normal level, the generation unit 31c determines whether or not the determination result is a prediction level (step S3). When the determination result is the prediction level, the generation unit 31c generates the prediction information D2 and stores the prediction information D2 in the memory 32 (step S4). Then, the processing returns to step S1.

If the determination result is not the prediction level, the generation unit 31c determines whether or not the determination result is a failure level (step S5). If the determination result is not the failure level, the processing returns to step S1. Meanwhile, when the determination result is the failure level, the generation unit 31c generates failure information and stores the failure information in the memory (step S6), and then ends the operation of the physical quantity sensor 1.

The sensor failure prediction system 100 described above includes the processor 31 and the memory 32, and the memory 32 stores the reference information D1 on a reference value of the drive signal DQ in the physical quantity sensor 1 including the vibrator element 10. Then, the processor 31 acquires the signal information SD on a measurement value of the drive signal DQ and outputs the prediction information D2 on a stepwise state until the physical quantity sensor 1 fails based on the signal information SD and the reference information D1. In the sensor failure prediction system 100 described above, the prediction information D2 on a stepwise or continuous process that the physical quantity sensor 1 fails is output, and thus, it is possible to detect in advance a state until the physical quantity sensor 1 fails.

Here, the vibrator element 10 is driven and vibrated by the drive signal DQ, and outputs the detection signals IQ1 and IQ2 based on physical quantities. In the present embodiment, the physical quantity sensor 1 includes the processor 31 and the memory 32 described above in addition to the vibrator element 10. Accordingly, it is possible to reduce processing of an apparatus in which the physical quantity sensor 1 is incorporated.

B. Electronic Apparatus

Figure 8:
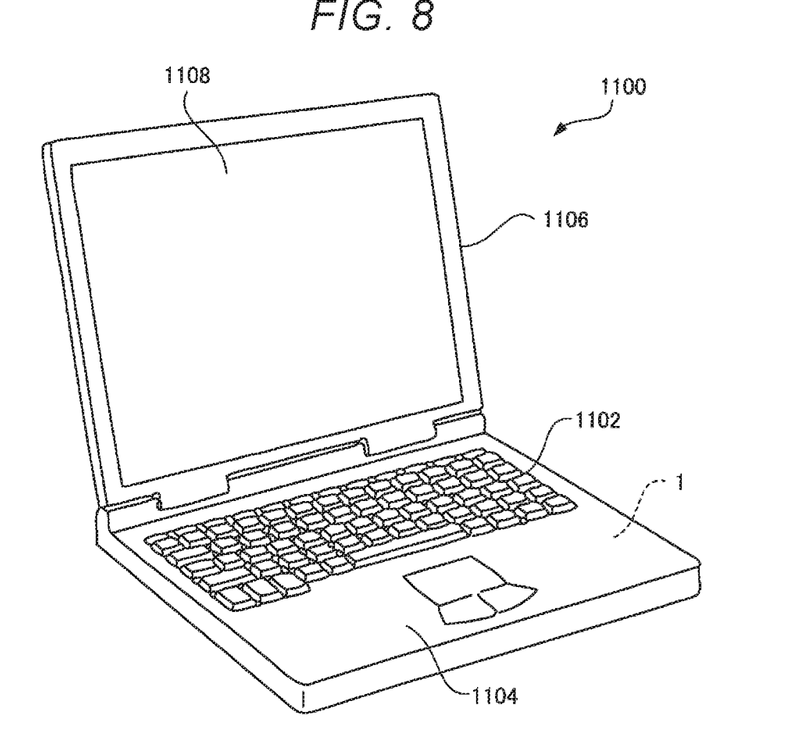
FIG. 8 is a perspective view schematically illustrating a configuration of a mobile type or a notebook type personal computer that is an example of an electronic apparatus.

FIG. 8 is a perspective view schematically illustrating a configuration of a mobile type or notebook type personal computer 1100 that is an example of an electronic apparatus. In this figure, the personal computer 1100 includes a main body portion 1104 having a keyboard 1102 and a display unit 1106 having a display portion 1108. The display unit 1106 is rotatably supported to the main body portion 1104 via a hinge structure. The physical quantity sensor 1 and the sensor failure prediction system 100 described above are embedded in the personal computer 1100 described above.

Figure 9:
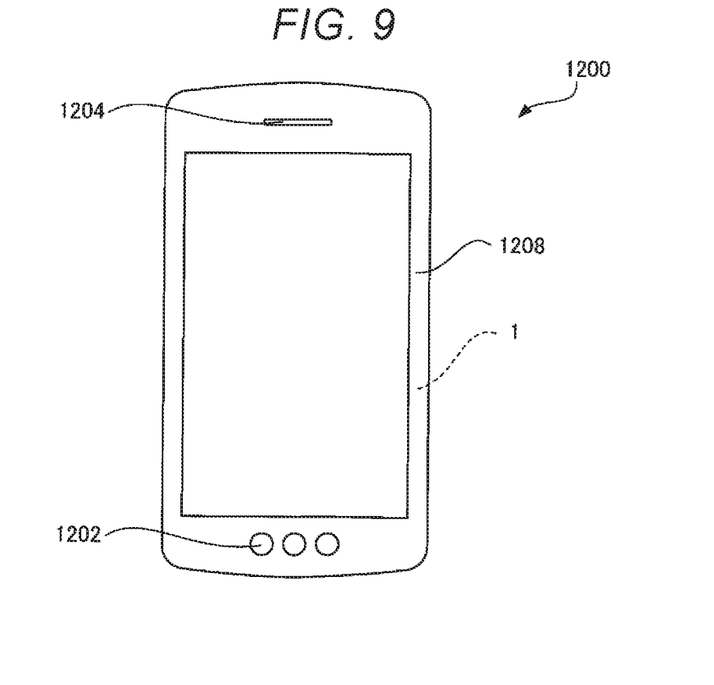
FIG. 9 is a plan view schematically illustrating a configuration of a smartphone that is an example of the electronic apparatus.

FIG. 9 is a plan view schematically illustrating a configuration of a smartphone 1200 that is an example of the electronic apparatus. In this figure, the smartphone 1200 includes a plurality of operation buttons 1202, an earpiece 1204 and a mouthpiece (not illustrated), and a display portion 1208 disposed between the operation buttons 1202 and the earpiece 1204. The physical quantity sensor 1 and the sensor failure prediction system 100 described above are embedded in the smartphone 1200 described above.

Figure 10:
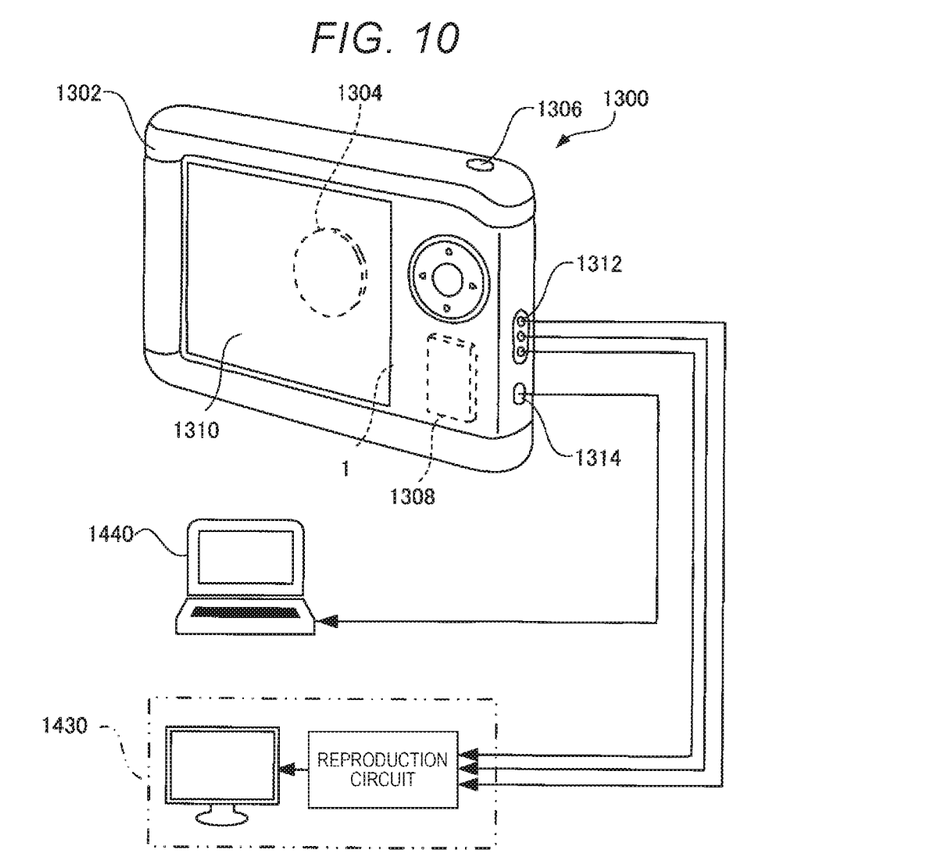
FIG. 10 is a perspective view schematically illustrating a configuration of a digital still camera which is an example of the electronic apparatus.

FIG. 10 is a perspective view schematically illustrating a configuration of a digital still camera 1300 which is an example of the electronic apparatus. In this figure, a connection with an external device is also simply illustrated. The digital still camera 1300 generates an imaging signal (image signal) by photoelectrically converting an optical image of an object by using an imaging element such as a charge coupled device (CCD).

A display portion 1310 that performs display based on an imaging signal from the CCD is provided on the back of a case 1302 in the digital still camera 1300. The display portion 1310 functions as a viewfinder that displays an object as an electronic image. A light receiving unit 1304 including an optical lens (imaging optical system), a CCD, and the like is provided on a front side (a back side in the drawing) of the case 1302.

If a photographer confirms an object image displayed on the display portion 1310 and presses a shutter button 1306, a CCD imaging signal at that time is transferred to the memory 1308 to be stored therein. In the digital still camera 1300, a video signal output terminal 1312 and an input/output terminal 1314 for data communication are provided on a side surface of the case 1302. As illustrated in the figure, a television monitor 1430 is connected to a video signal output terminal 1312, and a personal computer 1440 is connected to an input/output terminal 1314 for data communication as necessary. Further, the imaging signal stored in the memory 1308 is output to the television monitor 1430 or the personal computer 1440 by a predetermined operation. The physical quantity sensor 1 and the sensor failure prediction system 100 described above are embedded in the digital still camera 1300 described above.

The above-described electronic apparatus includes the sensor failure prediction system 100. Accordingly, before the physical quantity sensor 1 fails, appropriate processing can be performed in advance based on the prediction information D2. For example, when the prediction information D2 indicates a prediction level, processing of prompting maintenance by using display on a display, voice, or the like can be performed as the appropriate processing. Here, when failure information is output, for example, processing or the like of turning on a warning lamp is performed. A part or the whole of the sensor failure prediction system 100 may be integrated with another configuration of the electronic apparatus.

In addition to the personal computer, the smartphone, and the digital still camera described above, for example, a mobile phone other than the smartphone, a tablet terminal, a timepiece, a car body posture detection device, a pointing device, a head-mounted display, an ink jet printer, a laptop personal computer, a television, a video camera, a video tape recorder, a navigation device, a pager, an electronic notebook, an electronic dictionary, a calculator, an electronic game device, a game controller, a word processor, a workstation, a video phone, a TV monitor for security, electronic binoculars, a point of sale system (POS) terminal, an electronic thermometer, a blood pressure meter, a blood glucose meter, an electrocardiogram measurement device, an ultrasonic diagnosis device, an electronic endoscope, a fish detector, various measurement apparatuses, various measurement instruments, a flight simulator, and the like can be used as an electronic apparatus in which the physical quantity sensor 1 is mounted.

C. Vehicle

Figure 11:
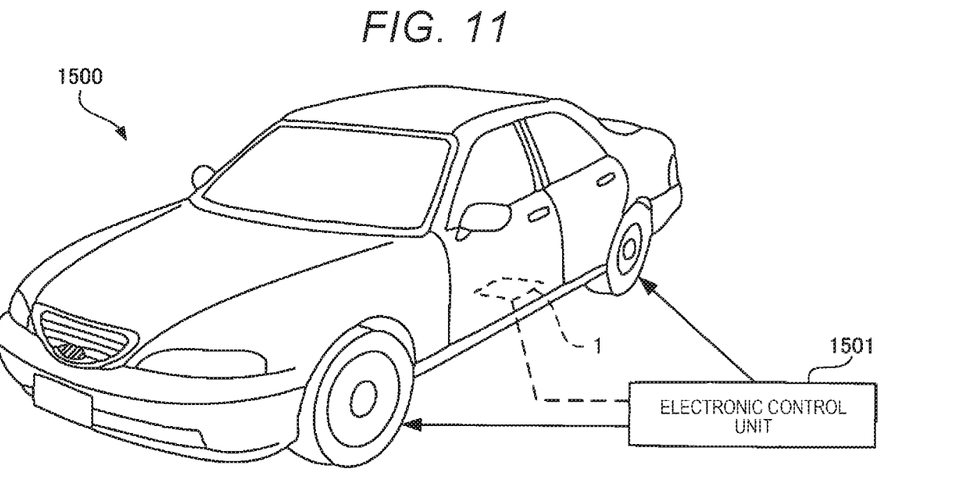
FIG. 11 is a perspective view schematically illustrating an automobile which is an example of a vehicle.

FIG. 11 is a perspective view schematically illustrating an automobile 1500 which is an example of a vehicle. In this figure, the physical quantity sensor 1 and the sensor failure prediction system 100 described above are embedded in the automobile 1500. The physical quantity sensor 1 can be widely applied to an electronic control unit (ECU) 1501 such as a keyless entry, an immobilizer, a navigation system, an air conditioner, an antilock brake system (ABS), an airbag, a tire pressure monitoring system (TPMS), an engine control, a battery monitor for a hybrid car or an electric car, a car body posture control system, or the like. In addition to the automobile, for example, a vehicle, an aircraft, a rocket, a ship, and the like can be used as the vehicle in which the electronic apparatus is mounted. A part or the whole of the sensor failure prediction system 100 may be integrated with another configuration of the vehicle.

The above-described vehicle includes the sensor failure prediction system 100. Accordingly, before the physical quantity sensor 1 fails, appropriate processing can be performed in advance based on the prediction information D2. As appropriate processing when the vehicle is an automobile, for example, when the prediction information D2 indicates the prediction level 1, processing of turning on a warning lamp in the electronic control unit 1501 of the automobile is used, and when the prediction information D2 indicates the prediction level 2, processing of prompting maintenance by using display on a display such as a car navigation, voice, or the like is used. Here, when failure information is output, for example, the processing of turning on the warning lamp is performed.

Further, when the vehicle is a flying body such as a drone, for example, when the prediction information D2 indicates the prediction level 1, only the processing of turning on the warning lamp is performed, and when the prediction information D2 indicates the prediction level 2, processing of limiting an operation conditions is performed in addition to the processing of turning on the warning lamp. Here, when the failure information is output, for example, processing of turning on a failure lamp to prohibit an operation of a flying object is performed.

D. Modification Example

As described above, the sensor failure prediction system, the sensor failure prediction method, the physical quantity sensor, the electronic apparatus, and the vehicle according to the present disclosure are described based on the illustrated embodiments, and the present disclosure is not limited to these. Further, configurations of the respective units of the present disclosure can be substituted by any structure which exhibits the same function of the embodiment described above, and any configuration can also be added thereto. Further, in the present disclosure, any configurations of the respective embodiments described above may be combined with each other.

Although a case where prediction information is generated by using a drive voltage that is a voltage value of a drive signal is exemplified in the above-described embodiment, the prediction information is not limited to the exemplification and, for example, may be generated by using a resistance value based on a current value of the drive signal as the measurement value. If a degree of vacuum in a package in which a physical quantity sensor contains a vibrator element decreases for some reason, the resistance value based on the current value of the drive signal increases according to the decrease. Accordingly, by using a reference value as the voltage value and the resistance value based on the current value of the drive signal as the measurement value, it is possible to output the prediction information on prediction of failure of the physical quantity sensor due to the degree of vacuum in the package. The resistance value is, for example, an equivalent series resistance value in an equivalent circuit of the vibrator element, a so-called crystal impedance (CI) value. The reference value is set appropriately.

Although a case where the prediction information is generated by using the drive signal is exemplified in the above-described embodiment, the prediction information is not limited to the exemplification and, for example, may be generated by using a detection signal. For example, a value of vibration components based on leakage vibration included in the detection signal regardless of presence or absence of a physical quantity, that is, a value of a zero-point signal also changes depending on a state until the physical quantity sensor fails. Accordingly, the prediction information may be generated by using a value of the zero-point signal. The reference value is appropriately set.

Furthermore, although a case where the prediction information is stepwise information until the physical quantity sensor fails is exemplified in the above-described embodiment, the prediction information is not limited to the exemplification and may be continuous information until the physical quantity sensor fails. In this case, for example, an operation of continuously changing the prediction information according to a difference or a ratio between a measurement value of the drive signal or the detection signal and the reference value may be performed.

Further, although a case where a circuit element embedded in the physical quantity sensor generates the prediction information is exemplified in the above-described embodiment, the present disclosure is not limited to the exemplification, and, for example, an external device of the physical quantity sensor may generate the prediction information by acquiring the drive signal of the vibrator element or the measurement value of or the detection signal from the physical quantity sensor. The external device is, for example, a device including the processor 101 and the memory 102 illustrated in FIG. 1.

Furthermore, although a case where the vibrator element is made of a piezoelectric material is exemplified in the above-described embodiment, the configuration material of the vibrator element is not limited to the exemplification and may be, for example, a non-piezoelectric material such as silicon or quartz. In this case, for example, the piezoelectric element may be provided on a base bode made of the non-piezoelectric material. Further, when the vibrator element is made of silicon, the vibrator element with high dimensional accuracy can be manufactured at a relatively low cost by using a known fine processing technique such as etching.

Although a case where a piezoelectric drive method is used as a method of driving the vibrator element is exemplified in the above-described embodiment, the method of driving the vibrator element is not limited to the exemplification and may be, for example, an electrostatic drive method or an electromagnetic drive method. Likewise, although a case where a piezoelectric detection method is used as a method of detecting the vibrator element is exemplified in the above-described embodiment, the method of detecting the vibrator element is not limited to this and may be, for example, a capacitance detection method, a piezoresistance detection method or an electromagnetic detection method.

Furthermore, although a case where the vibrator element is a double T-type sensor element is exemplified in the above-described embodiment, the vibrator element is not limited to the exemplification and may be, for example, an H tuning fork type sensor element or a another sensor element of a tuning fork type. Further, a support member for supporting the vibrator element to the package is not limited to the above-described TAB mounting member, and may be integrally made of, for example, the same material as the vibrator element.

Further, although a case where a physical quantity sensor is a gyro sensor that detects an angular velocity is exemplified in the above-described embodiment, the physical quantity sensor is not limited to the exemplification. For example, the physical quantity sensor may be an acceleration sensor or the like that detects acceleration as a physical quantity.

Furthermore, although a configuration in which a base has a box shape and a lid has a plate shape is illustrated in the above-described embodiment, the configuration is not limited to the exemplification. For example, the base may have a plate shape and the lid may have a box shape or a hat shape.

What is claimed is:

1. A sensor failure prediction system that predicts a failure of a physical quantity sensor including a vibrator element which is driven and vibrates by a drive signal and outputs a detection signal based on a physical quantity, comprising:
   a memory that stores reference information on a reference value of the drive signal or the detection signal; and
   a processor that outputs prediction information on a stepwise or continuous state until the physical quantity sensor fails, based on signal information on a measurement value of the drive signal or the detection signal and the reference information.

2. The sensor failure prediction system according to claim 1, wherein
   the memory stores the reference information in advance.

3. The sensor failure prediction system according to claim 1, wherein
   the processor outputs the prediction information when the physical quantity sensor starts up.

4. The sensor failure prediction system according to claim 1, wherein
   the reference information includes information on a first range indicating a range for the reference value, and information on a second range indicating a range for the reference value in a range different from the first range, and
   the processor outputs first prediction information when the measurement value is within the first range, and outputs second prediction information different from the first prediction information when the measurement value is within the second range.

5. The sensor failure prediction system according to claim 1, wherein
   the measurement value is a voltage value of the drive signal.

6. The sensor failure prediction system according to claim 1, wherein
   the measurement value is a resistance value based on a current value of the drive signal.

7. The sensor failure prediction system according to claim 1, wherein
   the physical quantity sensor has a package in which the vibrator element is contained, and
   the prediction information includes information on prediction of a failure due to a degree of vacuum in the package.

8. A sensor failure prediction method of predicting a failure of a physical quantity sensor including a vibrator element which is driven and vibrates by a drive signal and outputs a detection signal based on a physical quantity, comprising:
   acquiring signal information on a measurement value of the drive signal or the detection signal; and
   outputting prediction information on a stepwise or continuous state until the physical quantity sensor fails based on the signal information and reference information on a reference value of the drive signal or the detection signal.

9. The sensor failure prediction method according to claim 8, wherein
   the prediction information is output when the physical quantity sensor starts up.

10. The sensor failure prediction method according to claim 8, wherein
    the reference information includes information on a first range indicating a range for the reference value, and information on a second range indicating a range for the reference value in a range different from the first range, and
    first prediction information is output when the measurement value is within the first range, and second prediction information different from the first prediction information is output when the measurement value is within the second range.

11. The sensor failure prediction method according to claim 8, wherein
    the measurement value is a voltage value of the drive signal.

12. The sensor failure prediction method according to claim 8, wherein
    the measurement value is a resistance value based on a current value of the drive signal.

13. The sensor failure prediction method according to claim 8, wherein
    the physical quantity sensor has a package in which the vibrator element is contained, and the prediction information includes information on prediction of a failure due to a degree of vacuum in the package.

14. A physical quantity sensor comprising:
a vibrator element that is driven and vibrates by a drive signal and outputs a detection signal based on a physical quantity;
a memory that stores reference information on a reference value of the drive signal or the detection signal; and
a processor that outputs prediction information on a stepwise or continuous state until the physical quantity sensor fails, based on signal information on a measurement value of the drive signal or the detection signal and the reference information.

15. An electronic apparatus comprising:
the sensor failure prediction system according to claim 1.

16. A vehicle comprising:
the sensor failure prediction system according to claim 1.

* * * * *